United States Patent [19]

Carbrey

[11] 4,322,697
[45] Mar. 30, 1982

[54] SAMPLING FILTER FOR REDUCING ALIASING DISTORTION

[75] Inventor: Robert L. Carbrey, Boulder, Colo.

[73] Assignee: Bell Telephone Laboratories, Incorporated, Murray Hill, N.J.

[21] Appl. No.: 166,791

[22] Filed: Jul. 8, 1980

[51] Int. Cl.³ ............................................. H03H 19/00
[52] U.S. Cl. .................................... 333/173; 328/151
[58] Field of Search ............................ 333/165–166, 333/173; 328/150–151, 167; 307/221 R, 221 C, 221 D, 238.1, 238.2, 238.8, 352–353, 520–523, 543, 239–243; 364/724; 179/1 D

[56] References Cited

U.S. PATENT DOCUMENTS

| | | | |
|---|---|---|---|
| 3,514,726 | 5/1970 | Poschenrieder | 328/165 X |
| 3,852,619 | 12/1974 | Carbrey | 328/167 X |
| 4,039,978 | 8/1977 | Heller | 307/221 D |
| 4,039,979 | 8/1977 | Carbrey | 328/167 X |
| 4,056,737 | 11/1977 | Sequin | 307/520 |
| 4,243,958 | 1/1981 | Wilde | 307/221 D |

Primary Examiner—Marvin L. Nussbaum
Attorney, Agent, or Firm—J. M. Graziano

[57] ABSTRACT

The subject sampling filter employs fractional period displacement of samples to force additional nulls in the filter characteristic response. This sampling method and cascading antialiasing filters provides a filter structure which minimizes the complexity of the circuit yet which provides great flexibility to implement a desired filter characteristic.

18 Claims, 8 Drawing Figures

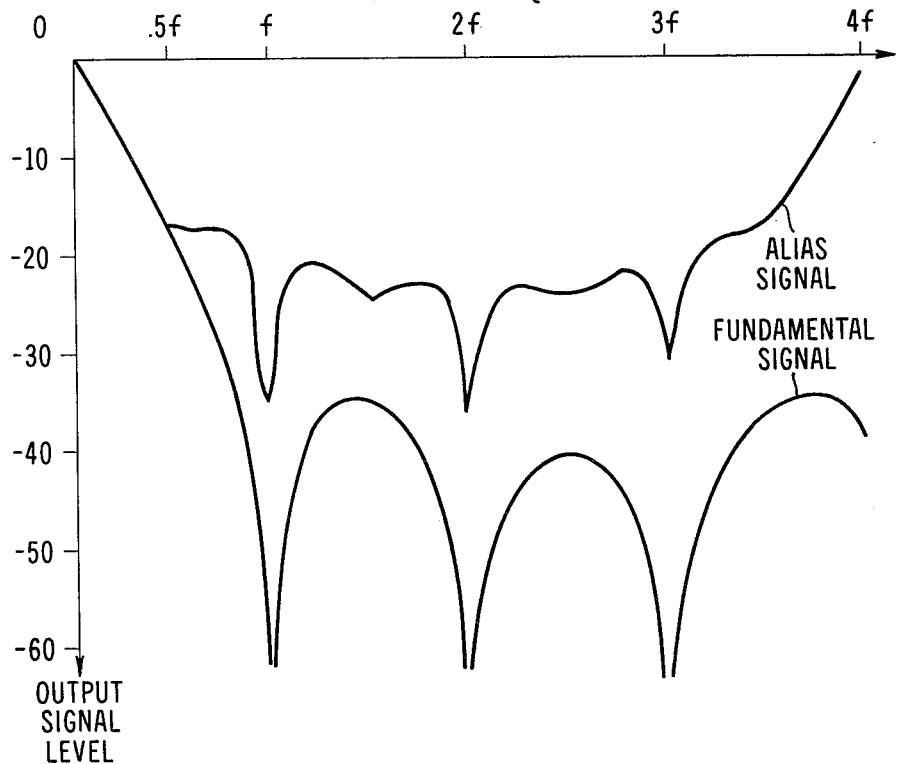

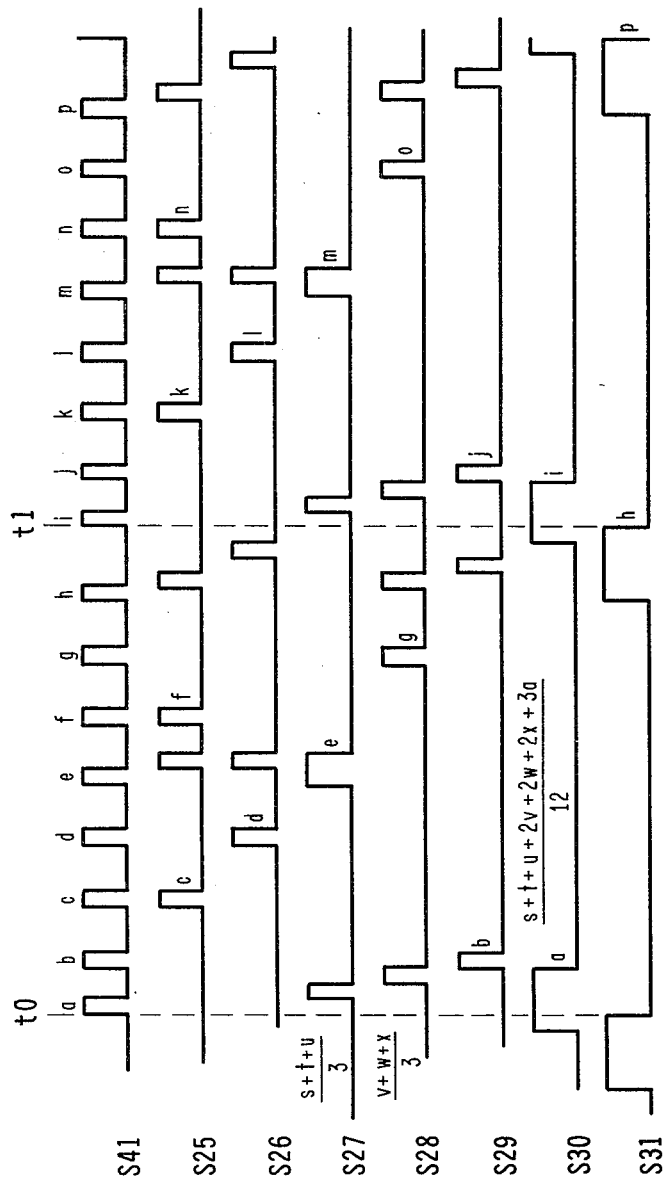

SAMPLING FILTER FOR REDUCING ALIASING DISTORTION

FIELD OF THE INVENTION

This invention relates to waveform sampling and, in particular, to a sampling filter for reducing aliasing distortion.

DESCRIPTION OF THE PRIOR ART

Waveform sampling as a method for the transmission of an analog signal has been long known to the art. Sampling has been used to enable a signal to be multiplexed, encoded, or filtered. This is generally accomplished by sampling the analog waveform at twice the highest frequency component of the wave, and this sampling frequency is called the Nyquist sampling rate.

However, practically speaking, the message spectrum is not band limited. The part of the message spectrum which is above the highest frequency F considered to be in the message band will also be sampled and will thereby cause distortion in the reconstructed signal. In particular, these undesired signal frequencies will be translated down in frequency by the sampling process and will fall within the band of the resultant reconstructed signal. This phenomenon of downward frequency translation is known as aliasing and can cause serious distortion problems.

Prior art aliasing distortion elimination circuits include a filter disclosed in U.S. Pat. No. 4,039,979 issued Aug. 2, 1977 to R. L. Carbrey, wherein a basic sample sum antialiasing filter samples a continuous wave signal at n times the Nyquist rate where n is an integer greater than one. The n most recently produced sequential samples are then combined at the Nyquist rate to produce a sequence of composite samples. This filter arrangement reduces the aliasing distortion compared with conventional sampling techniques or sample and hold gating.

Another prior art distortion elimination circuit is disclosed in U.S. Pat. No. 3,852,619 issued Dec. 3, 1974 to R. L. Carbrey, wherein a basic sample cancel equalizer functions to eliminate distortion in the reconstructed signal. The sample cancel equalizer is a recursive filter which employs charge redistribution between two capacitors after each sample is taken to compensate for distortion in the reconstructed signal. The selection of capacitor ratios and amplifier gain determine the frequency characteristics of this compensation circuit.

The difficulty with these above-mentioned distortion elimination circuits is that they are limited both in flexibility and accuracy. To extend these designs to meet the stringent band-pass characteristics required for advanced data transmission circuits would increase both the size and the complexity of these circuits to the point of possibly making them uneconomical or impractical to realize. Additionally, the sample cancel equalizer develops its maximum compensation at half the Nyquist sampling frequency at which frequency a substantial loss is now required.

SUMMARY OF THE INVENTION

The sampling filter of the present invention solves this problem by employing fractional period displacement of samples. The preferred embodiment of this sampling filter is a low pass filter which cascades a sample sum antialiasing filter with a sample cancel equalizer and a second sample sum antialiasing filter. This combination of antialiasing filter circuits which use the new fractional period displacement scheme provides flexibility and simplifies the resultant filter design. In operation, the first and second antialiasing filters provide the out-of-band loss by generating nulls at harmonics of the Nyquist rate sampling frequency and at frequencies corresponding to the fractional period displacements and most of the harmonics of those frequencies.

The sample cancel equalizer provides an additional filtering characteristic with increasing output as the inband signal frequency increases. This compensates the inband loss due to the two antialiasing filters and the sample hold operation to produce the required flat response. The peak of the compensation is shifted to less than half the base Nyquist sampling rate by additional displacement of the feedback samples. The first and second antialiasing filters provide additional loss to limit the output at repeated out-of-band peaks generated by the sample cancel equalizer.

Each sample sum antialiasing filter employs fractional period displacement of samples to obtain the selected low pass or any other type of required signal rejection. To accomplish this requires establishing a base sampling rate applicable to both of the sampling sum antialiasing filters and then selecting various combinations of samples for each filter to null the desired frequencies. All combinations of samples must be integral fractional multiples of the base sampling rate, thereby minimizing the complexity of the filter structure without adversely affecting its flexibility. By the proper selection of the sampling frequencies and the fractional period displacements, the two antialiasing filters operate conjunctively and nulls can be forced wherever required to obtain the filter characteristic desired.

Thus, by employing fractional period displacement of samples and charge redistribution or charge integration for summing samples, the disclosed filter depends on precise timing pulse generation and capacitor ratio control for accuracy rather than requiring critical component values. Both high attenuation and fast roll off characteristics can be obtained by cascading two or more fractional period displacement sampling filters with an equalizer circuit inserted after each stage of filtering. This preferred embodiment of the disclosed filter uses a combination of cascaded filters operating cooperatively, using the fractional period displacement scheme to therebyproduce a filter with excellent characteristics.

BRIEF DESCRIPTION OF THE DRAWINGS

FIG. 3 illustrates signal waveforms indicating the details of operation of the sample averaging filter circuit of FIG. 2;

FIG. 4 illustrates a plot of amplitude vs. frequency for signals output by the sample averaging filter circuit of FIG. 2;

FIG. 8 illustrates timing diagrams for the sampling filter of FIG. 5.

GENERAL DESCRIPTION

As was mentioned above, waveform sampling as a method for transmission of an analog wave has long been known to the art. Sampling has been used to enable a signal to be multiplexed, encoded, or filtered. A simple circuit commonly used for sampling an analog wave is the sample and hold circuit which consists of an electronic switch for sampling the analog wave and a storage capacitor for storing the sample taken. These samples are then transmitted to the destination where a detector is typically used to reconstruct the sampled signal.

Figure 1:
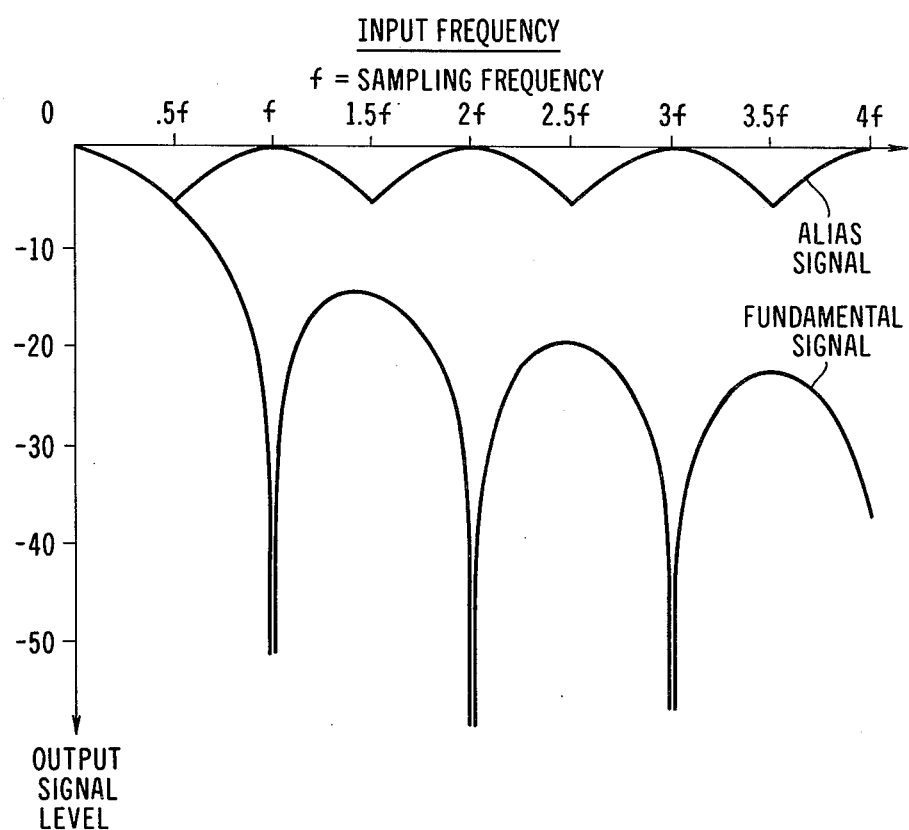
FIG. 1 illustrates a plot of amplitude vs. frequency for signals output by a typical sampler circuits.

When operated as a low pass filter, this circuit just mentioned works on the principle that all of the information contained in an analog wave can be conveyed by samples of its amplitude if such samples are taken at greater than twice the highest frequency component (F) of the analog wave. This is the well-known "Nyquist" sample rate f. In reconstructing the analog wave from these samples, the output from the sampler loses amplitude, above frequency F, finally reaching a nadir at the sampling frequency f. Beyond the first null at frequency f, the amplitude rises to an attenuated peak at 1.5 times the sampling frequency (1.5f) and descends to the second null at the sampling frequency's second harmonic (2f) and so forth. This peaking is due to the fact that as the input frequency approaches the Nyquist rate sampling frequency f, the phase difference of successive cycles of the input frequency which can be sampled decreases. When the input frequency corresponds to the sampling rate f, there is no difference in phase of successive samples. Therefore, there is no output frequency component at this frequency. This nadir in output magnitude of the input signal frequency which is reached at the sampling frequency and its harmonics will be called a null for the rest of this description. The resulting output samples of null frequency signals do have a fixed (dc) magnitude corresponding to the amplitude of the input signal at whatever phase the samples happen to fall. The reconstructed sampled signal as well as the amplitude of alias frequencies produced by the sampler are depicted in FIG. 1.

"Alias" frequencies are output signals within the half sampling rate bandwidth (f/2) of the sampler, that are produced as modulation sideband products about dc, the sampling frequency f, and its harmonics due to input signals outside of the half sampling rate bandwidth (f/2) of the sampler. Thus, any input signals greater than f/2 will be reflected down into the wanted baseband. The resulting "aliased" output frequency is as far removed from dc as the input signal is removed from the sampling frequency f or its nearest harmonic. Aliasing frequencies are harmonically related to the sample rate (f) in such a way that samples taken of individual waves combine to make the lower frequency alias. In the basic sampling circuit that has been described, the alias produced is within a few dB of the amplitude of the input wave. This is illustrated in FIG. 1 which is a plot of the output amplitudes of both the alias signal and the sampled or fundamental signal. The resulting confusion of signals makes this sampler useless as a filter for frequencies above f/2.

SAMPLE AVERAGING FILTER—FIGS. 2-4

An elaboration of this basic sampler circuit, however, does much to reduce the amplitude of the alias signal. This is the sample averaging filter shown in FIG. 2 and taught by U.S. Pat. No. 4,039,979, issued Aug. 2, 1977 to R. L. Carbrey. As is demonstrated in FIG. 2, the input wave is periodically sampled by switch 220 and the samples are connected in succession by switches 211 to 214 to capacitors 201 through 204 to successively take a first through a fourth sample. Then, while switch 220 is open between the fourth sample and the first sample of the next sampling cycle, capacitors 201 to 204 are shorted together by simultaneously closing switches 211 to 214, thereby averaging the charges as the result of charge redistribution among capacitors 201 to 204. After the samples are averaged, but still before the sampling cycle repeats itself and a first sample is again taken, switch 221 closes, transmitting the averaged sample to the destination, i.e., demodulator 222. Switches 212 to 214 and 221 open before the first sample of the next sampling cycle is taken. So four samples are taken for each averaged sample transmitted. The averaging process causes deep nulls in both the fundamental and alias signals transmitted by the filter. In this particular circuit, a null is produced where the four averaged samples add up to zero amplitude. This applies to both fundamental and alias frequencies.

Figure 2:
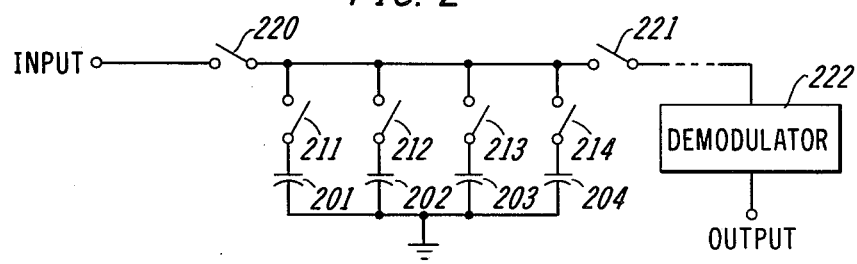
FIG. 2 illustrates a sample averaging filter circuit.

FIG. 3 illustrates how an alias frequency is annulled by the filter illustrated in FIG. 2. The case shown is where the sample averaging rate is the third harmonic (3f) of the sample frequency (f), i.e., four samples are taken for each average transmitted. The rate and amplitude of the samples taken are depicted in FIG. 3. It is evident from this figure that the samples taken would yield an alias of the full amplitude of the input wave if they were transmitted unaltered. Averaged in groups of four, however, the sum of the sample amplitudes is zero. That is, samples of amplitudes A and $-A$ (see FIG. 3) averaged with the two zero amplitude samples, as indicated by the brackets in FIG. 3, equal zero. FIG. 4, the plot of amplitude and frequency for the filter just described, illustrates three such nulls: at the averaging rate f and at the second (2f) and third harmonics (3f) of the averaging rate. The alias at the fourth harmonic (4f) of the averaging rate is the "first full alias", that is, the alias of the full amplitude of the input wave which occurs at the lowest input frequency. This alias occurs at a frequency that is the product of the sample averaging rate f and the number of sample periods (4) per average. Thus, for the case just discussed, the alias occurred at four times the averaging rate as illustrated in FIG. 4. Thus, low pass filters are commonly designed so that the highest frequency admitted to the filter is lower than the first full aliasing frequency to take advantage of this filter characteristic.

Two concepts make it possible to increase the number of nulls between the passband and the first full alias: quench interval bridging and fractional period displacement. A sample is quenched when new information replaces it. In the examples given, samples are quenched when a capacitor is recharged after the average has been transmitted. A quench interval then, is the period which ranges from the transmission of one average to the transmission of the next average, since sample information is replaced between transmissions. Thus, quench interval bridging is where a sample or average is stored during one interval for use in the next. Fractional period displacement is where a plurality of sample summing operations are concurrently being executed with each sum occurring some fixed period of time away (i.e. displaced) from the other sums. An example of fractional period displacement is given hereinbelow.

THE CASCADED FILTER—FIG. 5

The preferred embodiment of the subject invention is composed of two filter circuits 501, 503 with an equalizer stage 502 inserted between the two filter circuits. By cascading the filters, many nulls can be forced between the passband and the first full alias so that unwanted signals cannot rise above very low output signal level. While it is possible to increase the number of nulls that can be forced by a given stage of filtration, the number of samples required to accomplish this grows exponentially for each added set of nulls beyond the one obtained by one fractional period displacement of samples. This is why cascaded filters are used in the preferred embodiment rather than a single filter with more complicated timing. To simplify the description of the filter disclosed herein, a description of the timing circuitry has not been provided. The timing circuitry can be implemented in well-known fashion by using shift register and logic circuits.

Because the output pulses from one filter are sampled by the next filter in a cascaded filter configuration, the quench rate of one filter must be an integer multiple of the sample rate of the next. This being so, each stage will have developed a complete sample for the successive stage to accept. In the preferred embodiment, for illustrative purposes, input filter 501 is the first stage (actually comprising two individual filter circuits) and has been selected to sample at a sampling frequency g of 128 kHz and to turn out summed averages at 64 kHz rate. Thus, a set of t samples must be combined to generate the average and, in this case, t=2. Although buffer/equalizer 502 is the second stage of the filter of the preferred embodiment, it delays the samples it receives, and the delayed samples are also transmitted to output filter 503 (which is the final stage) at a 64 kHz rate. The final stage (output filter 503) accepts these samples at the given rate and, for illustration purposes, is shown averaging eight of the received samples at a time. Thus, output filter 503 transmits averages to the output terminal of the filter at an 8 kHz sampling rate. For the filter of the preferred embodiment therefore, 8 kHz is the base rate at which the system connected to the sampling filter output terminal is assumed to accept samples from the subject cascaded filter.

INPUT CIRCUIT 504

Figure 5:
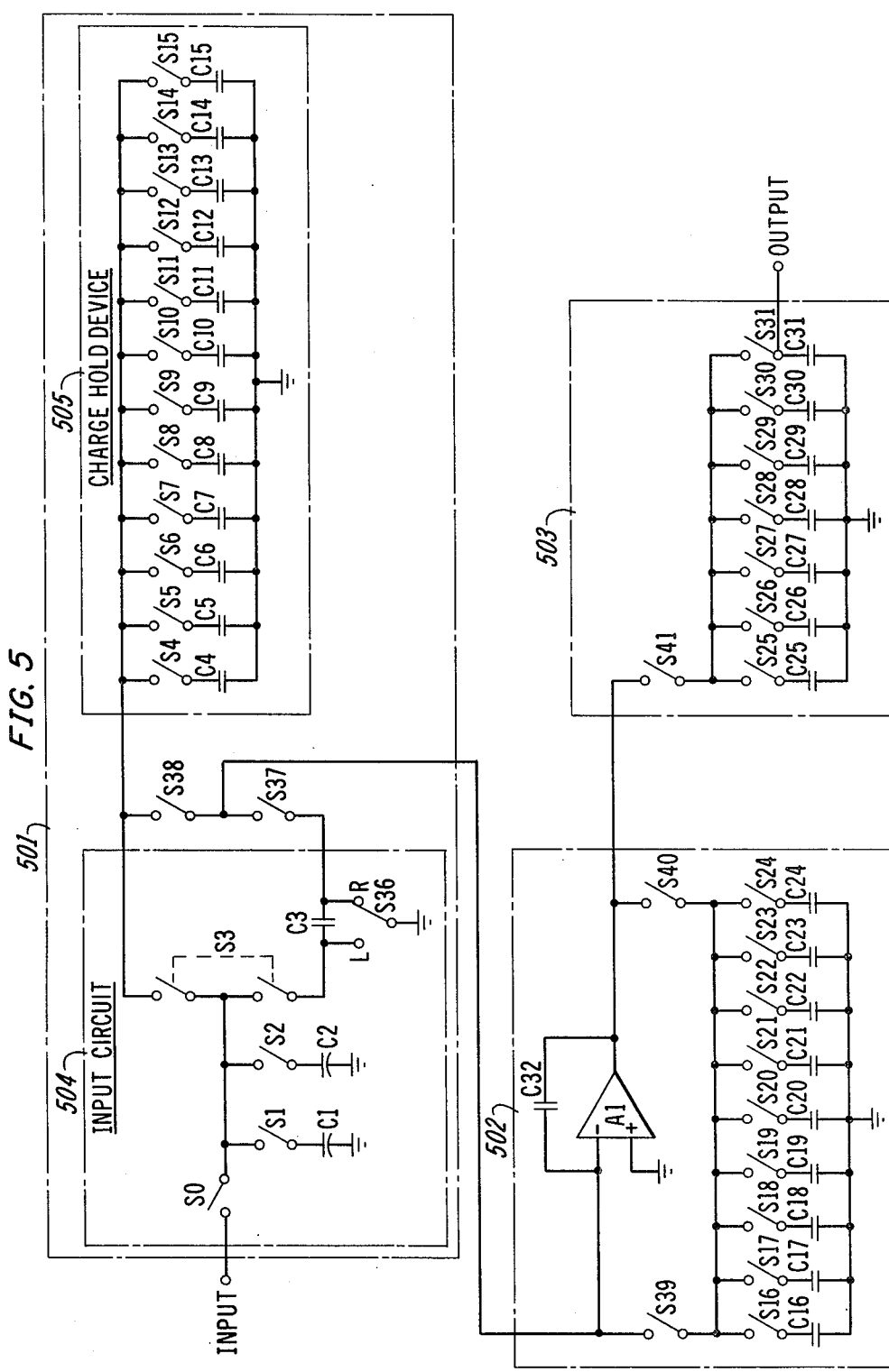
FIG. 5 illustrates the preferred embodiment of the sampling filter of my invention.

The input circuit 504 of sampling filter 501 of FIG. 5 is analogous in function to two samples averaging filters (of the type just described) operating in parallel and using fractional period displacement of samples. The quench rate, as mentioned above, has been selected to be f/s or 64 kHz and alternate sets of samples, for illustration purposes, are displaced from each other by half the period of a 67 kHz signal. The selection of the 67 kHz displacement frequency was totally discretionary. In this particular sitution, it is desired for illustration purposes to force a null which will suppress frequencies at incidental peaks above and below the null at 64 kHz obtained by averaging pairs of samples displaced by half periods of 64 kHz therefore the selection of the 67 kHz half period displacement frequency accomplishes this. So two half-periods of the 64 kHz samples are averaged, as well as two half-periods of the 67 kHz samples are averaged per quench interval. Because of the principles taught above, amplitude nulls are to be found at all harmonics of 64 kHz and 67 kHz except multiples of the second harmonic (that is, nulls are at all odd harmonics). Selection of 67 kHz in this example also illustrates that the displacement frequency at the input need not be an integer harmonic of the base sampling frequency as long as the first average or sum interval is an integer harmonic; 64 kHz is an eighth harmonic of 8 kHz in this example. In addition to the nulls forced by input circuit 504 of antialiasing filter 501, charge hold device 505 will be used as part of a running sum filter to force nulls at frequencies which are determined by the number of samples stored therein. Thus, for illustrative purposes, a twelve capacitor charge hold device is disclosed in the preferred embodiment. This implementation of a running sum filter will therefore force nulls at one-twelfth of the sampling frequency (64 kHz) or 5.333 kHz and all harmonics of 5.333 kHz. As can be seen from this description, the filter designer has great flexibility in selecting a multitude of nulls, using a number of independent sections of antialiasing filter 501.

RUNNING SUM FILTER

The twelve sample charge hold device 505, capacitor C3, and the switches S36 and S38 connected to them comprise a running sum filter, which filter was referred to above. Twelve sample charge hold device 505 allows an input sample stored at one point in time to be switched to the output where it appears twelve sample periods later. Samples are stored by charge hold device 505 on capacitors C4 to C15, which capacitors, for this filter, are each the same size as capacitor C3. So when a sample is taken, it is stored on capacitor C3 and on a selected one of capacitors C4 to C15. Since capacitors C3 to C15 are identical in size, the charge on the selected capacitor will be the same as the charge on capacitor C3. Since this stored sample is switched to the output terminal of sampling filter 501 twelve samples later and, at that time, algebraically added (by the next stage buffer/equalizer 502) to the then-current sample just transmitted by capacitor C3, the stored sample cancels the corresponding (inverted) sample developed twelve sample periods earlier when capacitor C4 was temporarily connected in parallel with capacitor C3. At any given time, therefore, the next stage (buffer/equalizer 502) will have the sum of only the last twelve samples. This amounts to twelve samples taken at a 64 kHz/12=5.333 kHz sample rate. From the principles taught previously in this document, it follows that a null may be expected at each harmonic of this sampling frequency of 5.333 kHz except at frequencies which are multiples of the twelfth harmonic. But the twelfth harmonic of 5.333 kHz is 64 kHz, which frequency was annulled by the input circuit 504 of this input filter. Thus, the first full alias resulting from input filter 501 may be expected at 128 kHz for the filter disclosed in this example.

INPUT CIRCUIT 504—DETAILED DESCRIPTION

The preferred embodiment of input circuit 504 shown in FIG. 5 uses accumulated averages to achieve the effect just described. Charges are stored on capacitor C1 and C2, which capacitors are equal in value. Charges are also stored on capacitors C3 and C4 to C15, which are the twelve capacitors which comprise charge hold device 505. These capacitors C3 to C15 are each half the value of capacitor C1 and will be treated as one capacitor for now because capacitor C3 and a selected one of capacitors C4 to C15 are connected in parallel during the input averaging procedure as will be discussed below.

Input circuit 504 requires a number of capacitors to accomplish the accumulated averaging and this number can be determined mathematically since up to $2^{n-1}$ samples can be summed by using n capacitors. In this scheme, samples are combined in pairwise fashion to obtain an average and successive averages are combined in pairwise fashion to obtain a sum. Thus, all samples are of equal weight in the final sum by using this pairwise combination scheme since all the sampling capacitors are of equal size.

In this circuit, a sample and an average are brought forward from the previous sampling cycle. The last of eight samples taken (h) in the previous sampling cycle is stored on capacitor C1 and the average of the sixth and seventh samples (f and g) of the previous sampling cycle is stored on capacitor C2. At the start of the current sampling cycle, a sample is taken during the first sampling period at time a by way of switches S0, S3 and S4, which switch (S4) is associated with the selected one of the capacitors (C4) in the running sum filter. Thus, the sample is stored on capacitors C3 and C4. When switch S0 opens, switch S2 closes and the average of samples h of the previous sampling cycle and a of the current sampling cycle $[(h+a)/2]$ is stored on capacitors C3 and C4. Next, during the second sampling period at time b, a sample is stored on capacitor C1 when switches S0 and S1 close. Between the second and third sample periods, times b and c, an average is taken of the two averages brought forward. So at the beginning of the third sample period at time c, the average stored on capacitors C3 and C4 is $[(f+g)/2+(h+a)/2]$. Thus, since capacitors C3 and C4 are identical in size, the sum of the samples is stored on each capacitor, resulting in each capacitor having a charge thereon which is equal to $(f+g+h+a)/4$. This average is transmitted (after inversion) by capacitor C3 to the second filter circuit of the input stage when switches S36 and S37 change states. This average also remains stored on capacitor C4 of charge hold device 505 for later use. Sample c is taken on to capacitor C2 by way of switches S0 and S2. Then between the third and fourth sample periods, times c and d, the average of samples b and c is stored on capacitor C2. Finally, when switches S0 and S1 close, a smaple d is taken during the fourth sample period. In this way, sample d and the average of samples b and c are brought forward for use in the next sampling cycle. The last sample taken (d) is stored on capacitor C1 and the average of samples b and c is stored on capacitor C2. A sample is taken during the fifth sample period at time e by way of switches S0 and S3 and this sample (e) is stored on capacitors C3 and C5. When switch S0 opens, switch S1 closes and the average of samples d and e $[(d+e)/2]$ is stored on capacitors C3 to C5. Next, during the sixth sample period at time f, a sample (f) is stored on capacitor C1 when switches S0 and S1 close. Between the sixth and seventh sample periods at times f and g, an average is taken of the two averages brought forward. So at the beginning of the seventh sample period at time g, the average stored on capacitors C3 and C4 is $[(b+c)/2+(d+e)/2]$ which amounts to a charge of $(b+c+d+e)/4$ stored on each capacitor. This average is transmitted by capacitor C3 to the second filter circuit of the input stage when switches S36 and S37 change states. The average is also stored on the selected capacitor (C5) of the charge hold device 505 for later use. Sample g is taken on capacitor C2 by way of switches S0 and S2. Then, between the seventh and eighth sample periods at times g and h, switches S1 and S2 close which causes an average of samples f and g to be stored on capacitor C2. Finally, switches S0 and S1 close to so sample h will be stored on capacitor C1. In this way, sample h and the average of samples f and g are brought forward again for use in the next sampling cycle. Again, this efficient averaging circuit provides amplitude nulls at the fundamental and all odd harmonics of 64 kHz and 67 kHz. The following section provides a detailed analysis of the timing of input circuit 504.

DETAILED DESCRIPTION OF INPUT CIRCUIT 504 TIMING

During the first period of an input cycle, switches S0, S3, and S4 close so that capacitors C3 and C4 may be charged to the input voltage. At this point in time, capacitor C1 still carries a charge that was acquired during the eighth period of the previous sampling cycle. The charge stored on capacitor C1 is averaged with the charges stored on capacitor C3 and capacitor C4 when switches S1, S3, and S4 close during the second period of the sampling cycle. Since capacitor C1 is the same size as the parallel value of capacitors C3 and C4, and since all three are charged to the sample value at the times indicated, the charge that results from connecting capacitor C1 in parallel with parallel connected C3 and C4 is one-half of the difference between capacitors C1 and C3–C4. So the charge on parallel capacitors C3 and C4 is an average of charges acquired during the present sampling cycle and the previous sampling cycle. Each of capacitors C3 and C4 (or other selected capacitor C4 through C15) will retain half of this average to pass on to stage 502. Having shared its charge with capacitors C3 and C4 during the second period, capacitor C1 is charged to the input voltage during the third period. Connection is made through switches S0 and S1. The fourth period in an input cycle is a waiting period for input circuit 504. Time is idly passed so that the total period between input samples will provide proper roll-off chracteristics for the filter. All switches are open during this time except switch S36 which connects (open) switch S37 to ground. At this point in time, capacitor C2 still carries a charge that was acquired during the seventh period of the previous sampling cycle. The charge on capacitor C2 is averaged with the charges on capacitors C3 and C4 when switches S2, S3, and S4 close during the fifth period of the cycle. The capacitors' charges are distributed as they were in the second period of this cycle. So the charge on capacitor C3 and C4 is now an average of samples taken during: the seventh and eighth periods of the previous sampling cycle (the charge from the seventh period is, itself, an average taken from the third and sixth periods), and a charge taken during the first period of the present sampling cycle. Having shared its charge with capacitors C3 and C4 during the fifth period capacitor C2 is charged to the input voltage during the sixth period. Connection is made through switches S0 and S2. During the seventh period of an input cycle, the charge on capacitor C2 (from the sixth period) is averaged with the charge on capacitor C1 (from the third period). The two capacitors are connected by switches S1 and S2.

This leaves capacitor C2 with an average of the charges acquired during the third and sixth periods of the input cycle. Having shared its charge with capacitor C2 during the seventh period, capacitor C1 is again charged to the input voltage during the eighth period. Connection is made through switches S0 and S1. The ninth period in an input cycle is a waiting period for input circuit 504. This period serves the same purpose as the fourth period. During the tenth period, the contents of capacitor C3 are output to the next stage. Two simultaneous switch actions make this possible. Switch S37 connects capacitor C3 to the input of the amplifier (Al) of buffer/equalizer 502 of FIG. 6, and at the same time, switch S36 grounds the L terminal of capacitor C3 (opening terminal R). Since capacitor C3 was charged with the R side grounded, and since the charge is transferred with the other (L) side grounded, the charge transferred to buffer/equalizer 502 is equal but opposite to the charge accumulated. Remember that capacitor C3 contains an average of charges accumulated during the first period of this cycle and the third, sixth, and eighth periods of the previous cycle. Averaging took place during the second and fifth periods of the present cycle. The eleventh period is also a time when information is output to buffer/equalizer 502. Again, two simultaneous switch actions make this possible. In this case, switch S38 connects the two stages and switch S5 connects capacitor C5 to switch S38. Capacitor C5 transfers a charge that is exactly equivalent to the charge just transferred by capacitor C3 except that it was accumulated during the twelfth previous period, and the charge is not inverted. As shown in FIG. 5, the charge hold device 505 consists of switches S4 through S15 and capacitors C4 through C15. The switches close one-by-one in numerical sequence and in synchronism with switches S3 and S38. So switch S4 will, for example close with S3 transferring a charge to C4 which is, in turn, held on capacitor C4 for transfer twelve samples later via switch S38 to the next stage. At the interstice of the twelfth and thirteenth (i.e., first sample of next sampling cycle) sample switch S38 opens, switch S3 closes, and switch S4 remains closed to transfer charges to capacitor C4 that make up the first sample. Switches S6 to S15 are similarly closed in turn to hold successive averages of the four input stage samples until it is time to transfer the change to the buffer stage, thus cancelling the contribution stored in that stage twelve sample periods earlier.

BUFFER/EQUALIZER 502—FIG. 5

Besides isolating the input stage (filter 501) from the output stage (filter 503), buffer/equalizer 502 is used in the preferred embodiment to peak at frequency below the base null of the input stage. This has the effect of flattening the frequency response of the passband and accentuating its rolloff. Since details of the buffer-/equalizer's operation are taught in U.S. Pat. No. 3,852,619 issued Dec. 3, 1974 to R. L. Carbrey, only general principles will be disclosed in this text.

Buffer/equalizer 502 consists of a summing amplifier Al, with shunt feedback storage capacitor C32, and a nine sample charge hold device consisting of switches S16 through S24 and associated capacitors C16 through C24. When an inverted sample is brought forward by switch S37 of antialiasing filter 501, or a quenching sample by switch S38 of the same filter, amplifier Al adds the charge representing the sample amplitude to the charge across capacitor C32. Because the charge on inverted capacitor C3 at the closure of switch S37 is in opposite polarity to that from the same sample average store on one of capacitors C4 to C15 which is brought forward later by the closure of switch S38, the charge stored on capacitor C32 from capacitor C3 will be cancelled later by the charge stored on one of the capacitors C4 to C15. Since amplifier Al is an inverting amplifier, it reinverts the phase of the inverted samples from capacitor C3 until such time as that sample is cancelled. Although amplifier Al is an inverting amplifier, it inverts both the inputs by way of switches S37 and S38 so that the interrelationship of these two signals is maintained. The signals stored on capacitors C16 to C24 are, therefore, all inverted by amplifier Al. The nine sample charge hold device, (switches S16 through S24 and capacitors C16 through C24), provides negative feedback to the amplifier at low frequencies and a controlled positive feedback at the peaking frequency. It accepts an inverted charge through switch S40 and contributes it at the input to the amplifier nine samples later through switch S39. This delay causes the necessary peak in the output characteristic near the top of the passband. To realize this peak, samples must be stored for a half period of the peaking frequency. In the example used to describe the preferred embodiment, samples are transferred to stage 502 at a 64 kHz rate. Output samples stored on C16 through C24 are fed back to the input nine 64 kHz periods late to produce an amplitude peak in the output characteristics at 3556 Hz. This peaking frequency (3556 Hz) is 1/18 of the sample rate (64 kHz) and half its period calls for twice the frequency or 1/9 the sample rate. So nine samples must be stored before the first sample is fed back to the summing amplifier to achieve this peaking frequency. Therefore, a nine sample charge hold device is used in this embodiment of buffer/equalizer 502. For the first eight time periods of an input sampling cycle (while capacitors C3 and one of selected capacitors C4 through C15 are being charged), buffer/equalizer 502 is at rest. During this period all switches connecting equalizer 502 are open. During the ninth period of an input sampling cycle, one of switches S16 through S24 is closed in sequence together with S39 and considering capacitor C16, these switches connect capacitor C16 to the input for the equalizer amplifier, Al. Before the connection, capacitor C16 carried a charge that was equivalent to the output of the amplifier during the ninth previous sampling cycle. The amount of charge stored on the sequentially selected one of capacitors C16 through C24 is proportional to the algebraic sum of the input charges and the gain of amplifier Al. This gain is set to obtain the amount of peaking required to obtain flat in-band gain. A typical gain value with C16 through C24=C1 is 2.3 which is controlled by the size of capacitor C32. When the connections are made, this charge is algebraically added to the charge on capacitor C32. Since capacitor C16 was charged by the output of amplifier Al, and since amplifier Al is an inverting amplifier, the charged returned during this period is the inverted equivalent of the output of amplifier Al during the ninth previous cycle. Consequently, the accumulated information added to capacitor C32 as of that time (upon the output of the second stage nine cycles ago) is algebraically added to the present value when switches S16 and S39 close. Because of a 180 degree phase reversal that takes place over this interval for frequencies of 3556 Hz the signal fed back at this frequency will be in phase with the present input signal from stage 501. Thereby generating a peak at this frequency. As the input frequency is decreased, the relative phase of the new signal and the value stored nine periods earlier change to become 180 degrees out-of-phase at dc and even harmonics of 3556 Hz. A part of the input signal is thus cancelled. This gradual change from partial cancellation at dc to in-phase addition at the 3556 Hz peak frequency compensates the rolloff due to both antialiasing filter stage 501 and 503 to give a flat in-band response. The charge that remains on capacitor C32 is the sum of the charges that have been input to A1 since the ninth previous time period. During the tenth period of a sampling cycle, switches S36, S37, S16, S40, and S41 close. Switches S36 and S37 connect capacitor C3 to the input of amplifier, A1. Before the connection, capacitor C3 carried an average of charges accumulated during the first period of the current sampling cycle and the third, sixth, and eighth periods of the previous sampling cycle. When the connections are made, this charge is algebraically added to the charge on capacitor C32. Since capacitor C3 was charged with the R side grounded, and since the charge is transferred with the other (L) side grounded, the charge transferred by means of amplifier A1 is equal but oppposite to the charge accumulated. This inverted charge is, in turn, inverted by amplifier A1; so the charge added to capacitor C32 is in phase with the input. Switches S16, S40, S41, and S25 connect two capacitors to the output of amplifier A1. One of these, capacitor C16 will be used to modify the current charge on capacitor C32 as described in the analysis of ninth period action (second preceding paragraph). The other capacitor, C25, accepts a charge from amplifier A1 to be averaged with charges (from the same source, amplifier A1) on other output capacitors. During the eleventh period of an input cycle, switches S5 and S38 close, connecting capacitor C5 to the input of amplifier A1. This capacitor returns a charge that is equivalent but opposite to the charge transferred by capacitor C3 during the twelfth previous input cycle. Since this is so, the accumulated information added to capacitor C32 as of that time (upon the input from the first stage twelve input cycles ago) is removed when switches S5 and S38 close. The charge that remains on capacitor C32 is the sum of the charges that have been input to amplifier A1 since the twelfth previous input cycle.

TWENTY-FOUR SAMPLE FILTER WITH FRACTIONAL PERIOD DISPLACEMENT

Figure 6:
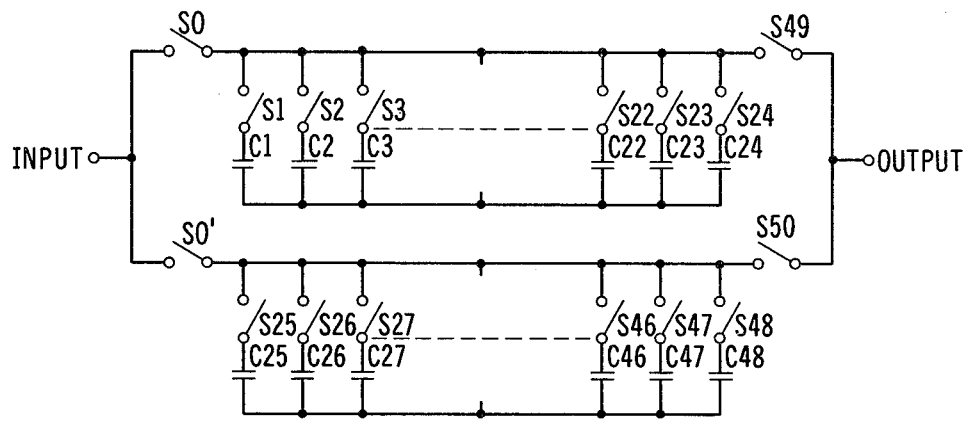
FIG. 6 illustrates a basic sample averaging filter that uses both quench interval bridging and fractional period displacement.
Figure 7:
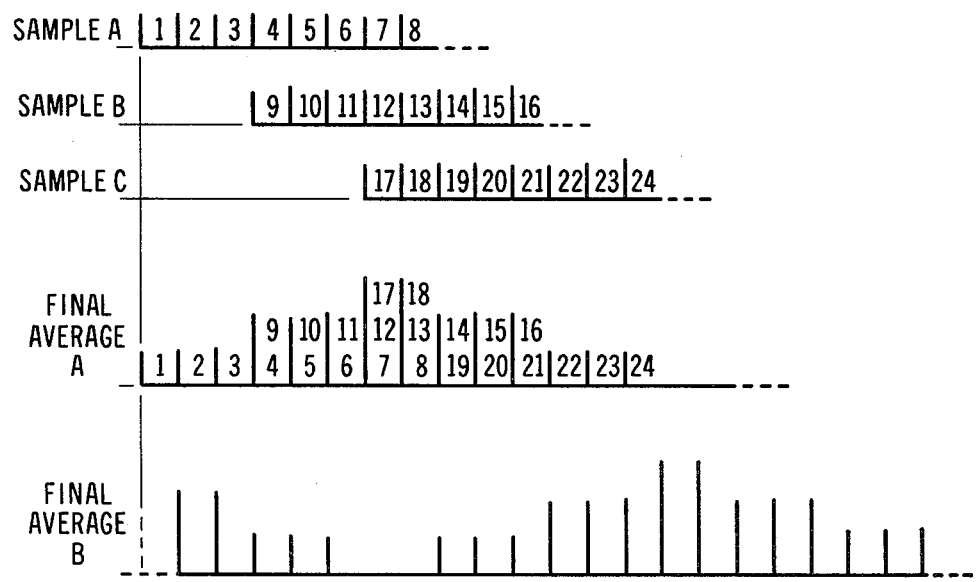
FIG. 7 illustrates timing diagrams for the sample averaging filter of FIG. 6.

Since, as mentioned above, the output stage antialiasing filter (503) (FIG. 5) takes samples at a sampling frequency f of 64 kHz rate and transmits averages at an 8 kHz rate, consider for illustration purposes a sample averaging filter that runs at these rates and that uses quench interval bridging and fractional period displacement. Such a filter is shown in FIG. 6, and a timing diagram is provided in FIG. 7. The schematic reveals two banks of capacitors, each capacitor connected to a common input/output bus for its bank, and each bank connected to an input switch (S0, S7) and an output switch (S49, S50). Like the quad sample filter described under the Input Filter section above, a sample is taken when the input signal is momentarily connected to a capacitor through the capacitor's associated switch and an input switch. Also like the simpler filter, bank of capacitors are connected in parallel to average their charges and the average is transmitted through the output switch. The fundamental difference lies in the timing of switch closures. The waveform starts just after an average is transmitted. A given bank of capacitors contributes every other average: waveform SAMPLE AVERAGE A of FIG. 7 shows averages sent by switch S49; waveform SAMPLE AVERAGE B of FIG. 7 shows averages sent by switch S50. In FIG. 7, the numbers on each waveform indicate the capacitor on which the sample is stored for that time period. As can be seen from the waveform SAMPLE AVERAGE A, some samples are stored on several capacitors, thereby weighting the average. Alternatively, capacitors of various sizes may be employed to also accomplish weighting of samples.

Thus, since the sampling frequency f is 64 kHz and averages must be transmitted at an 8 kHz rate, a set of s samples must be combined to generate the average and, in this case, $s=8$. This combination forces nulls at a frequency of f/s at all harmonics of this frequency up to the sampling frequency f. To force additional nulls, fractional period displacement is used. To accomplish this, a plurality (n) sets of these s samples are combined wherein each of these n sets of s samples are timewise displaced from the successive set of s samples by a fraction x of the sampling period. For illustration purposes, let us assume that $n=3$ and $x=\frac{3}{8}$. Thus, we will combine three sets of eight samples to obtain the final average. Each of these sets of eight samples will be displaced from the successive set of eight samples by a time equal to $\frac{3}{8}$ of the sampling period and, since a sampling period is the length of time it takes to generate a set of eight (s) samples, this is $\frac{3}{8}$ multiplied by eight (s) times the period for one sample taken at the sampling frequency f (64 kHz) or 140.625 μsec. This is illustrated in FIG. 9 where the first sample [see waveform SAMPLE A of FIG. 7] is taken shortly after an average is transmitted by switch S49 and is part of the first set of samples. After three sample periods have passed, a second set of eight samples is started [waveform SAMPLE B of FIG. 7], and a third set starts after six periods [waveform SAMPLE C of FIG. 7]. After the third set, all 24 capacitors of the upper bank are connected in parallel by their switches and to the output bus by switch S49. Here then, is an example of both quench interval bridging and period displacement: the 24 samples just cited are stored during two quench intervals (from the start of the timing diagram until the second average is taken), and sets of eight (s) samples are displaced from each other by three sample periods (x). So the function of the upper bank of capacitors is accounted for. The lower bank works the same way except that samples are taken between closures of switch S50. Therefore, the average charge of capacitors C1 through C24 go out by way of switch S49, then the average charge of capacitors C25 through C48 go out by way of switch S50. Keeping in mind that the first full alias occurs at the product of the averaging rate f/s (8 kHz) and the number of sample periods s (8) per average, it follows that the first full alias will occur at 64 kHz. As with the quad averaging filter described above, so this filter causes a null at each harmonic of the averaging rate f/s except at (in this case) eighth harmonics. So there is a null at 8 kHz and a null at each 8 kHz interval to 64 kHz. But each set of eight (s) samples also constitutes a sample and there are three (n) sets of eight samples. The sets are displaced 46.875 μs (xs/f) apart so these three "samples" (which are sums of eight samples each) are taken inside of a $46.875 \times 3 = 140.625$ μs frame [(nxs)/f]. Since this is the period of a 7.111 kHz wave there is also a null at each harmonic of 7.111 kHz except those related to the third harmonic since three (n) sums are averaged. So this output filter produces thirteen nulls between 8 kHz and 64 kHz, which frequency is the ninth harmonic of 7.111 kHz. These nulls are at the fundamental frequency and at the seven harmonics of 8 kHz and at the fundamental frequency and those harmonics of 7.111 kHz not related to the third harmonic. Since it may be impractical to use 24 capacitors in a filter, the following circuit which is identical in function is used in the preferred embodiment.

OUTPUT STAGE-ANTIALIASING FILTER 503

In the previous example, 24 samples were taken at 14 points in time. The timing of these samples is shown in FIG. 7. Where a sample was taken on two or three capacitors, it would count for two or three times as much as a sample taken and stored on a single capacitor. This is equivalent to a weight having been assigned to each sample. Sample weight is depicted as line length in FIG. 7, the final average waveform and the numbers of the capacitors taking the samples and storing the associated charges are set out along each line. Samples are shown arrayed along a time line between two averages. The average charge on the other 24 capacitors is taken and transmitted between samples 6 and 7 as shown in FIG. 7. The output stage, sampling filter 503 of FIG. 5, substitutes intricate timing for the large network of capacitors. Switch timing is so arranged that preliminary averages are taken of a few samples at a time, stored on capacitors and further averaged with other samples or averages. The objective of these manipulations is to synthesize the action of the sample averaging filter as shown in FIG. 6. FIG. 8 reveals the timing of switches S25 through S31 and switch S41 of sampling filter 503 in FIG. 5. Two timing cycles are shown of an indefinite series of samples. To the left of the diagram are reference designators that identify which switches close when the time lines go high. As you can see in FIG. 8, the capacitor served by each of these switches has the same number as its associated switch. So when switch S25 closes, for example, associated capacitor C25 is connected to the input bus. Entering FIG. 8 from the left are two intermediate averages brought forward from the previous cycle. These are: $(s+t+u)/3$ and $(v+w+x)/3$. The cycle begins at time T0 where switch S31 opens, isolating capacitor C31 (and consequently the filter's output) from further change. At this time (T0) switch S41 closes, connecting an input sample (a) through switch S30 to capacitor C30. When switch S41 opens, switch S27 closes connecting capacitors C27 to C30 and averaging the charges on these capacitors. The charge on capacitor C30 now amounts to $[(s+t+u)/3+a]/2$. When switch S27 opens, switch S28 closes, connecting capacitor C28 to capacitor C30 and averaging the charges on these capacitors. The charge on capacitor C30 is now $\{[(s+t+u)/3+a]/2+(v+w+x)/3\}/2$ which adds up to: $(s+t+u+2v+2w+2x+3a)/12$. Notice that the weight of these samples is exactly that shown on FIG. 8 and matches half the pattern shown on FIG. 7. Just before sample b is taken therefore, half of the first averaging cycle shown on FIG. 8 will be stored on capacitor capacitor C30. The next samples to be taken and averaged are b through h. Sample b is taken when capacitor C29 is connected to the input by switches S29 and S41. Sample b is stored on capacitor C29 for later use. Samples c, d and e are next taken on capacitors C25, C26, and C27 by way of their dedicated switches and switch S41. Between samples e and f, the three capacitors are connected in parallel, averaging their charges so that $(c+d+e)/3$ is stored on both capacitors C26 and C27 for later use. Samples f, g, and h are next taken on capacitors C25, C28, and C31 by way of their dedicated switches and switch S41. Next, the three capacitors are connected in parallel averaging their charges so that $(f+g+h)/3$ is stored on each of capacitors C25, C31 and C28. Switches S25 and S28 open, and the charge on capacitor C28 is stored for later use. The third action to take place between samples h and i is that switch S29 closes, connecting capacitor C29 to C31 thereby averaging the charges on these capacitors so that $[(f+g+h)/3+b]/2$ appears on capacitor C31. Next switch S29 opens and switch S26 closes, connecting capacitor C26 to C31 and averaging the charges on these capacitors. The charge on capacitor C31 is now $\{[(c+d+e)/3+b]/2+(f+g+h)/3\}/2$ which adds up to: $(3b+2c+2d+2e+f+g+h)/12$. The weight of these samples is exactly that shown on FIG. 8. The final act of the circuit before T1 is to open switch S26 and close switch S30, averaging the contents of capacitors C30 and C31. Since capacitor C30 was charged to an average that matches half the pattern shown on FIG. 9, and since the charge on capacitor C31 matches the other half, this average of the two constitutes a complete analogy of the average of 24 capacitors' contents as taken by the 24 sample averaging filter. The average of samples s through h then, as it appears on capacitor C31, amounts to $(s+t+u+2v+2w+2x+3a+3b+2c+2d+2e+f+g+h)/24$, and this is the signal that appears at the output of the circuit until capacitor C31 must again be charged just prior to time T2. The output signal stored on capacitor C31 is utilized during the time that switch S31 is open.

OUTPUT STAGE

During the seventh period of an output cycle, three states occur in sequence. First, switch S31 closes along with switch S41 so capacitor C31 may be charged by amplifier A1. Second, with switch S30 still closed, switch S41 opens and switch S27 closes. The contents of capacitors C27 and C30 are averaged by means of these switch closures. The charge on capacitor C27 was an average of charges taken from amplifier A1 during the first through third periods of this output cycle (capacitor C30 was charged as just described). Third, with switch S30 still closed, switch S27 opens and switch S28 closes. Again the contents of capacitor C31 are averaged, this time with the contents of capacitor C28. The charge on capacitor C27 was an average of charges taken from amplifier A1 during the fourth through sixth periods of this output cycle (capacitor C30 carries the charge just described). During the eighth period of an output cycle, switches S41 and S29 close so that capacitor C29 may accept a charge from amplifier A1. During the first period of an output cycle, switches S41 and S25 close so that capacitor C25 may accept a charge from amplifier A1. During the second period of an output cycle, switches S41 and S26 close so that capacitor C26 may accept a charge from amplifier A1. During the third period of an output cycle, two states occur in sequence. First, switch S27 closes along with switch S41 so capacitor C27 may be charged by amplifier A1. Second, with switch S27 still closed, switch S41 opens and switch S25 closes along with switch S26. The contents of capacitor C25, C26, and C27 are averaged by means of these switch closures. Since each of these capacitors was charged by amplifier A1, and since each such sample was taken in sequence, the average of amplifier A1 outputs for periods one through three appears on capacitors C25 through C27 at the end of the third period. During the fourth period of an output cycle, switches S41 and S25 close so the charge on capacitor C25 is changed to match the output of amplifier A1. During the fifth period of an output cycle, switches S41 and S28 close so capacitor C28 may accept a charge from amplifier A1. During the sixth period of an output cycle, five states occur in sequence. First, switches S41 and S31 close so capacitor C31 may be charged by amplifier A1. Second, with switch S31 still closed, switch S41 opens and switch S25 closes along with switch S28. The contents of capacitors C31, C25, and C28 are averaged by means of these switch closures. So each of these capacitors has a charge that is the average of charges taken from A1 during the last three periods (fourth, fifth, and sixth). Third, with switch S31 still closed, switches S25 and S28 open and switch S29 closes. Again the contents of capacitor C31 are averaged, this time with a charge (on capacitor C29) that was taken during the eighth period of the preceding cycle. Fourth, with switch S31 still closed, switch S29 opens and switch S26 closes. The charge on capacitor C26 was an average of charges taken from amplifier A1 during periods one, two, and three. This charge is averaged with the charge on capacitor C31. Fifth, with switches S30 and S31 closed and the other output switches open, charges are averaged between capacitors C30 and C31. After the switches change, capacitor C30 will be charged to the average of its former contents and those of capacitor C31 (an average of signals input by amplifier A1 during the last seventh period of this cycle). The voltage across capacitor C31 is the output voltage of the filter. For this reason, the output of the filter changes rapidly during the sixth period of an output cycle culminating in the signal that will remain until the next sixth period.

The subject filter works like the 48 capacitor filter described in the background material in that all averaging rates are related to the sampling rate. The sampling rate (64 kHz) equals the product of the averaging rate (8 kHz) and the number of sample periods (8) per average. The offset of 46.875 $\mu$s between sets of samples makes a group of three sets occur within a time frame of the period of a 7.111 kHz wave or one ninth of the sampling rate. Finally, this filter produces thirteen nulls between 8 kHz and 64 kHz: at seven harmonics of 8 kHz, and at those harmonics of 7.111 kHz not related to the third.

SUMMARY

The input circuit 504 of sampling filter 501 causes nulls at 64 kHz and 67 kHz. The running sum filter imposes 22 additional nulls, at harmonics of 5333 Hz, before the first full alias. Besides providing an interface between the input and output stages, the buffer/equalizer flattens the frequency response of the passband. And the output filter produces 26 nulls between 7111 Hz and 128 kHz. So if white noise were introduced at the input to the filter, 50 nulls would be perceived in the frequency spectrum at the output from the passband to the first full alias at 128 kHz. Between none of these nulls would the incidental output of the filter exceed 30 db below the input amplitude. Thus, by using fractional period displacement and cascaded filters, a very sharp low pass filter characteristic was realized. As can be seen from the above-description, the designer has great flexibility in selecting nulls and thereby designing the output spectrum of the filter, without having to resort to complex circuitry.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and scope of the invention. These include charge summation in an integrating amplifier.

I claim:

1. A sampling filter for reducing aliasing distortion comprising:
    sampling means for obtaining samples of an analog waveform at some predetermined sampling frequency f;
    a plurality of storage means for storing a set of s samples on each of said storage means, wherein each of said sets of s samples is timewise displaced from the successive one of said sets of s samples by a fraction x of the sampling period; and
    summing means for combining a plurality of x said sets s of stored samples.

2. The invention of claim 1 wherein said summing means combines n of said sets of s samples at a time with n being an integer greater than 1; and
    wherein said sampling filter includes switch means for concurrently applying each of said samples to n of said storage means for storage therein.

3. The invention of claim 2 wherein said summing means combines n timewise successive sets of s samples for forcing a null in the output characteristic of said sampling filter at a null frequency and at all harmonics of said null frequency except multiples of the nth harmonic up to the sampling frequency f wherein said null frequency is given by $f/(n \times s)$.

4. The invention of claim 3 wherein each of said storage means comprises a plurality of storage devices, the number m of said storage devices being ns which is the number of sets of samples n simultaneously combined by said summing means multiplied by the number of samples s stored in each of said storage means.

5. The invention of claim 4 wherein each of said s samples in each of said n sets of s samples is stored in an individual one of said ns storage devices.

6. The invention of claim 5 wherein each of said ns storage devices comprises a capacitor for storing a charge thereon which charge represents said sample.

7. The invention of claim 6 wherein said summing means includes bridging means for simultaneously connecting together said ns capacitors to obtain an average of said samples stored on said s capacitors by charge redistribution of the charges stored on said capacitors.

8. The invention of claim 7 wherein said bridging means comprises ns switch means associated on a one to one basis with said ns capacitors, with one side of each said switch means being connected to one terminal of said associated capacitor, the other terminal of all of said ns capacitors being connected together, and the other side of each said switch means being connected to a common bus for interconnecting said ns capacitors via said ns associated switch means.

9. The invention of claim 8 wherein said other terminal of all of said ns capacitors is connected to circuit ground.

10. The invention of claim 3 wherein each of said storage means comprises a plurality of storage devices, the number m of said storage devices being a function of the number t of samples stored in each of said storage means wherein said number m of devices is given by: $t=2^{m-1}$.

11. The invention of claim 10 wherein said filter includes partial sum means for summing subsets of said sets of s samples and storing said subset sums in selected ones of said storage devices.

12. The invention of claim 11 wherein each of said storage devices comprises a capacitor for storing a charge thereon representing the subset sums or samples cumulatively stored in said storage device.

13. The invention of claim 12 wherein said partial sum means includes bridging means for simultaneously connecting together said selected ones of said storage devices to obtain an average of said samples stored in said storage devices by charge redistribution among the capacitors comprising said selected ones of said storage devices.

14. The invention of claim 13 wherein said bridging means comprises m switch means associated on a one to one basis with said capacitors, with one side of each said switch means being connected to one terminal of said associated capacitor, the other terminal of all said capacitors being connected together, and the other side of each said switch means being connected to a common bus for interconnecting all or some of said capacitors via said associated switch means.

15. A sampling filter for reducing aliasing distortion comprising:
   first filter section comprising, first sampling means for obtaining samples of an analog waveform at some predetermined sampling frequency g;
   a first plurality of storage means for storing a first set of t samples on each of said storage means, wherein each of said sets of t samples is timewise displaced from the successive one of said sets of t samples by a first fraction y of the sampling period;
   first summing means for combining a plurality of said sets of t stored samples to form a sum signal;
   second filter section connected to said first filter section and comprising:
   second sampling means for obtaining samples of said sum signal at some predetermined sampling frequency f;
   a second plurality of storage means for storing a second set of s samples on each of said storage means, wherein each of said sets of s samples is timewise displaced from the successive one of said sets of samples by a second fraction x of the sampling period;
   second summing means for combining a plurality of said sets of s stored samples;
   wherein said first and said second sampling frequencies g and f are integral multiples of a common base sampling frequency b.

16. The invention of claim 15 wherein said first summing means combines m of said sets of t samples at a time with m being an integer greater than 1; and
   said second summing means combines n of said sets of s samples at a time with n being an integer greater than 1.

17. The invention of claim 16 wherein said first filter section includes first switch means for concurrently applying each of said samples of said analog waveform to m of said first plurality of storage means for storage therein;
   said second filter section includes second switch means for concurrently applying each of said samples of said sum signal to n of said second plurality of storage means for storage therein;
   said summing means combines m timewise successive sets of s samples for forcing a null in the output characteristic of said sampling filter at a null frequency and at harmonics of said null frequency wherein said null frequency is given by $f/(n \times s)$; and
   said second summing means combines n timewise successive sets of t samples for forcing a null in the output characteristic of said sampling filter at a null frequency and at harmonics of said null frequency wherein said null frequency is given by $g/(myt)$.

18. The invention of claim 15 wherein said first summing means includes partial sum means connected between said first summing means and said second filter section for storing a plurality of said sum signals on a third plurality of storage means and for combining said plurality of said sum signals to generate a new sum signal which new sum signal is applied to said sampling means.

* * * * *